United States Patent
Daval Frerot et al.

(10) Patent No.: US 11,346,911 B2
(45) Date of Patent: May 31, 2022

(54) MAGNETIC RESONANCE FINGERPRINTING IMAGE RECONSTRUCTION AND TISSUE PARAMETER ESTIMATION

(71) Applicant: Siemens Healthcare GmbH, Erlangen (DE)

(72) Inventors: Guillaume Daval Frerot, Lawrenceville, NJ (US); Xiao Chen, Princeton, NJ (US); Mariappan S. Nadar, Plainsboro, NJ (US); Peter Speier, Erlangen (DE); Mathias Nittka, Baiersdorf (DE); Boris Mailhe, Plainsboro, NJ (US); Simon Arberet, Princeton, NJ (US)

(73) Assignee: Siemens Healthcare GmbH, Erlangen (DE)

(*) Notice: Subject to any disclaimer, the term of this patent is extended or adjusted under 35 U.S.C. 154(b) by 760 days.

(21) Appl. No.: 16/238,554

(22) Filed: Jan. 3, 2019

(65) Prior Publication Data
US 2020/0041597 A1 Feb. 6, 2020

Related U.S. Application Data

(60) Provisional application No. 62/713,146, filed on Aug. 1, 2018.

(51) Int. Cl.
*G01N 33/48* (2006.01)
*G01R 33/56* (2006.01)
(Continued)

(52) U.S. Cl.
CPC ..... *G01R 33/5608* (2013.01); *G01R 33/4818* (2013.01); *G01R 33/4828* (2013.01); *G06N 3/08* (2013.01)

(58) Field of Classification Search
CPC .... G01R 33/5659; G01R 33/36; A61B 5/055; G06F 19/24; G06F 19/18
(Continued)

(56) References Cited

U.S. PATENT DOCUMENTS

| | | | | |
|---|---|---|---|---|
| 2011/0234220 A1* | 9/2011 | Mitchell | ............. | G01N 24/081 324/303 |
| 2016/0341810 A1* | 11/2016 | Rich | ................ | G01R 33/56316 |
| 2017/0261578 A1* | 9/2017 | Zhao | ..................... | G01R 33/50 |

FOREIGN PATENT DOCUMENTS

| | | | | |
|---|---|---|---|---|
| CN | 106408610 A | * | 2/2015 | ........... G06T 7/0012 |
| CN | 105912790 A | * | 8/2016 | ........... G06F 30/367 |

OTHER PUBLICATIONS

CN 106408610 A, Comaniciu, Feb. 2015 (Year: 2015).*
(Continued)

*Primary Examiner* — Walter L Lindsay, Jr.
*Assistant Examiner* — Frederick Wenderoth

(57) ABSTRACT

Machine training a network for and use of the machine-trained network are provided for tissue parameter estimation for a magnetic scanner using magnetic resonance fingerprinting. The machine-trained network is trained to both reconstruct a fingerprint image or fingerprint and to estimate values for multiple tissue parameters in magnetic resonance fingerprinting. The reconstruction of the fingerprint image or fingerprint may reduce noise, such as aliasing, allowing for more accurate estimation of the values of the multiple tissue parameters from the under sampled magnetic resonance fingerprinting information.

20 Claims, 8 Drawing Sheets

(51) Int. Cl.
  *G06N 3/08* (2006.01)
  *G01R 33/48* (2006.01)
(58) Field of Classification Search
  USPC .............................................. 324/309; 702/19
  See application file for complete search history.

(56) References Cited

OTHER PUBLICATIONS

CN 105912790 A, Huang, Aug. 2016 (Year: 2016).*

Cohen, Ouri, Bo Zhu, and Matthew S. Rosen. "MR fingerprinting deep reconstruction network (DRONE)." Magnetic resonance in medicine 80.3 (2018): 885-894.

Hoppe, Elisabeth, et al. "Deep Learning for Magnetic Resonance Fingerprinting: A New Approach for Predicting Quantitative Parameter Values from Time Series." Stud Health Technol Inform 243 (2017): 202-206.

Yang, Mingrui, et al. "Low rank approximation methods for MR fingerprinting with large scale dictionaries." Magnetic resonance in medicine 79.4 (2018): 2392-2400.

Zhao, Bo. "Model-based iterative reconstruction for magnetic resonance fingerprinting." Image Processing (ICIP), 2015 IEEE International Conference on IEEE, 2015.

Wang, Zhe, et al. "Magnetic Resonance Fingerprinting with compressed sensing and distance metric learning." Neurocomputing 174 (2016): 560-570.

\* cited by examiner

FIG. 9  T1

| Noise (%) | RMSE (ms) | | | | Relative Error (%) | | | |
|---|---|---|---|---|---|---|---|---|
| | 1D | 1D+1D | 2D | 2D+1D | 1D | 1D+1D | 2D | 2D+1D |
| 0 | 77.28 | 68.35 | 26.43 | 18.82 | 5.39 | 4.81 | 1.94 | 1.4 |
| 5 | 78.22 | 110.03 | 30.11 | 23.35 | 5.48 | 7.04 | 2.48 | 1.74 |
| 15 | 85.7 | 233.33 | 52.69 | 47.05 | 6.22 | 14.68 | 5.21 | 4.11 |
| 25 | 98.75 | 351.97 | 76.53 | 74.3 | 7.42 | 23.93 | 7.75 | 7.1 |

FIG. 10  T2

| Noise (%) | RMSE (ms) | | | | Relative Error (%) | | | |
|---|---|---|---|---|---|---|---|---|
| | 1D | 1D+1D | 2D | 2D+1D | 1D | 1D+1D | 2D | 2D+1D |
| 0 | 36.28 | 15.69 | 6.73 | 4.97 | 13.13 | 10.34 | 3.45 | 2.04 |
| 5 | 36.39 | 28.88 | 8.16 | 7 | 13.14 | 13.59 | 4.16 | 2.46 |
| 15 | 36.97 | 70.44 | 15.37 | 14.64 | 13.34 | 30.35 | 7.6 | 4.87 |
| 25 | 37.88 | 108.6 | 21.46 | 20.67 | 14.1 | 52.66 | 10.6 | 7.82 |

MAGNETIC RESONANCE FINGERPRINTING IMAGE RECONSTRUCTION AND TISSUE PARAMETER ESTIMATION

RELATED APPLICATION

The present patent document claims the benefit of the filing date under 35 U.S.C. § 119(e) of Provisional U.S. Patent Application Ser. No. 62/713,146, filed Aug. 1, 2018, which is hereby incorporated by reference.

BACKGROUND

The present embodiments relate to magnetic resonance (MR) imaging. Magnetic resonance fingerprinting (MRF) is a technique for multiparametric quantitative imaging. Multiple parameters (e.g., T1, T2, PD, etc.) are measured by applying a pseudo-random excitation with an under-sampled acquisition. For each pixel, the measured response over time (i.e., fingerprint) is matched to a dictionary of possible responses. The matched dictionary entry provides the values of the multiple parameters. MRF provides multiple parameter values in less time than needed to separately scan for each parameter.

The under sampled images present aliasing artifacts. It is challenging for the dictionary matching to estimate accurate tissue parameters due to the aliasing. The tissue parameter estimation also relies on the establishment of a pre-determined dictionary, which consists of fingerprints generated on a certain grid of the tissue parameter space. This approach is time consuming, computation memory hungry, and subject to quantization error.

Several approaches have been proposed to mitigate the above issues of MRF. Iterative reconstruction schemes have been proposed where MRF image reconstruction and tissue parameter estimation are carried out iteratively. Dictionary compression and random singular value decomposition (SVD) have been proposed to address the dictionary size. More recently, deep learning has been introduced to MRF. Most proposed networks play the role of the tissue parameter estimation where a single or a batch of fingerprints are input to neural networks (such as fully-connected or convolutional network), which output directly the corresponding tissue parameters. The high level of noise in the input signal results in longer training and makes the neural network hard to learn, with problems like more convergence or overfitting resulting in poor quality. Simple data processing such as sliding average for the fingerprints has been used to decrease the noise level, but this approach may erase certain dynamic features encoded in the fingerprints and thus make the estimated tissue parameters error prone.

SUMMARY

Systems, methods, and instructions on computer readable media are provided for machine training a network for and use of the machine-trained network for tissue parameter estimation for a MR scanner using MRF. The machine-trained network is trained to both reconstruct a fingerprint image or fingerprint and to estimate values for multiple tissue parameters in MRF. The reconstruction of the fingerprint image or fingerprint may reduce noise, such as aliasing, allowing for more accurate estimation of the values of the multiple tissue parameters from the under sampled MRF information.

In a first aspect, a method is provided for tissue parameter estimation for a magnetic resonance scanner using magnetic resonance fingerprinting. Magnetic resonance data is acquired from a magnetic resonance fingerprinting scan of a patient by the magnetic resonance scanner. Values for a plurality of tissue parameters are estimated from the magnetic resonance data. An image processor estimates by applying the magnetic resonance data as an input to a machine-trained network, which includes an architecture incorporating reconstruction from the magnetic resonance data and regression of the estimating from the reconstruction. A magnetic resonance image or images from the values of the plurality of tissue parameters is displayed.

In one embodiment, k-space data is acquired with a pseudo-random sequence. The k-space data is applied as the input to the machine-trained network. In an alternative embodiment, fingerprints in object space are obtained using forward Fourier transform of k-space data, and applied as the input to the machine-trained network.

The machine-trained network was trained to output a reconstruction of the input as part of the estimation. The estimation may be an estimation of the reconstruction as one or more fingerprints in object space with less noise than the input.

In another embodiment, the magnetic resonance data is acquired as data for a two-dimensional distribution of fingerprints. The reconstruction is estimated as the two-dimensional distribution of the fingerprints. Alternatively, the magnetic resonance data is acquired as data for a single fingerprint. K-space may be generated by scanning a spatial distribution, such as 2D. After the scanning and before input to the machine-trained network, a forward Fourier transform of the 2D k-space is applied, but a single fingerprint from the whole 2D fingerprints is input to the machine-trained network. The machine-trained network receives the single fingerprint or receives fingerprints one-by-one. The reconstruction is estimated as the single fingerprint.

The machine-trained network for estimation includes a first neural network for the reconstruction and a second neural network for the regression. The machine-trained network may be a neural network having been trained with a reconstruction loss for the reconstruction and a regression loss for the regression. Three different approaches may be used in training with these two losses. The machine-trained network may have been sequentially trained with the reconstruction loss and then the regression loss. The machine-trained network may have been trained end-to-end with the reconstruction loss and the regression loss. The machine-trained network may include an encoder and a decoder connected by a bottleneck where the encoder and decoder may have been trained with the reconstruction loss and another network may receive feature values from the bottleneck where the other network may have been trained with the regression loss.

In one embodiment, the values are estimated for at least two tissue parameters from the group of T1, T2, and PD. The image or images being displayed are for the at least two tissue parameters from the group of T1, T2, and PD.

In a second aspect, a method is provided for machine training a network for tissue parameter estimation using MRF. A neural network is defined as having an architecture with a first network configured to reconstruct a reconstructed fingerprint and a second network configured to regress estimates of tissue parameters from the reconstructed fingerprint. A machine trains the neural network with ground truth data for reconstruction and ground truth data for regression. The trained network is stored.

In one embodiment, the neural network is defined to have the first network configured to reconstruct a spatial distribution of fingerprints including the reconstructed fingerprint and to have the second network configured to regress the estimates for each location in the spatial distribution.

In another embodiment, the first network is trained with an input of fingerprints with noise and the ground truth for the reconstruction is the fingerprints with less of the noise.

Different approaches to use the ground truths in the training may be used. For example, the first network is trained with the ground truth data for reconstruction, and then the second network is trained with the ground truth for regression using the trained first network. As another example, the first and second networks are trained end-to-end as the neural network using both a reconstruction loss based on the ground truth for the reconstruction and a regression loss based on the ground truth for the regression. In yet another example, the first network is an encoder connected to a decoder through a bottleneck, and the second network is configured to receive feature values from the bottleneck. The encoder and decoder are trained with the ground truth for the reconstruction, and the second network is trained with input of the feature values from the bottleneck with the ground truth for regression.

In one embodiment, the second network is defined to regress the estimates of tissue parameters as two or more selected from the group of T1, T2, PD, off-resonance, magnetic transfer, B1 and any other MR tissue parameter. For training, the ground truth for the regression is the two or more selected from the group of T1, T2, PD, off-resonance, magnetic transfer, B1 and any other MR tissue parameter.

Any one or more of the aspects described above may be used alone or in combination. Any of the training or application acts or method steps may be performed by a system and/or provided by processor executable instructions stored on a non-transitory computer readable storage medium. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

FIG. 9 is a table showing performance of the various machine-trained networks for the T1 tissue parameter, and FIG. 10 is a table showing performance of the various machine-trained networks for the T2 tissue parameter.

DETAILED DESCRIPTION OF EMBODIMENTS

Learning-based MRF image reconstruction and tissue parameter estimation is provided. The under sampling in MRF is addressed with a denoising pipeline provided by including the reconstruction. The network is designed with the aim of both reconstructing the fingerprints and tissue parameter estimation. The machine-learned or learning network has a structure decomposing the MRF reconstruction problem into a cascade of a denoising problem and a regression sub-problem. A joint reconstruction and regression problem defines the network, utilizing more information (e.g., both reconstruction and parameter estimation) to machine train the network. The output of the network may be both reconstructed (denoised) fingerprints and estimated values of multiple tissue parameters.

For training, there are two losses. The first loss relies on the difference between the output of the reconstruction part of the network and the corresponding ground truth fingerprints. The second loss relies on the difference between the output of the regression part of the network and the ground truth tissue parameter values. The network architecture brings additional knowledge during the training stage of any appropriate kind of neural network architecture by using a reconstruction loss on one allocated part and a regression loss on another allocated part or the whole network. The network is taught how the fingerprints should be in a fully-sampled case, and, in that way, the noise is distinguished from the true information. Overfitting may be reduced, and the convergence of the network in training may occur more rapidly. The resulting estimates of the tissue parameters are more accurate even with the aliasing from under sampling in MRF.

Figure 1:
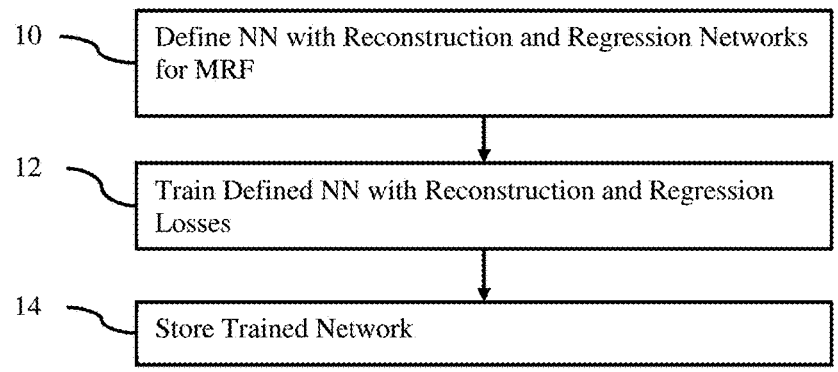
FIG. 1 is a flow chart of one embodiment of a method for tissue parameter estimation for a MR scanner using MRF.

FIG. 1 shows a flow chart of one embodiment of a method for machine training a network for tissue parameter estimation using MRF. A network architecture is designed to have both reconstruction of a fingerprint or fingerprints with less noise and estimation of values of multiple tissue parameters.

The method is implemented by a computer and memory. For example, a user interface is used by a programmer to define the network. A workstation, server, or another image processor trains based on data from a database. The trained network is stored in the database and/or another memory, such as the memory of an MR scanner.

The acts are performed in the order shown (top to bottom or numerical) or other orders. Additional, different, or fewer acts may be provided. For example, acts for use of the trained network are provided. As another example, acts for defining or selecting the training data are provided.

In act 10, a user defines a network for machine learning. The user selects or configures the architecture using a user interface on a computer. The user defines layers and structure of the architecture.

The architecture is for any type of machine learning. For example, a support vector machine is defined. In one embodiment, a neural network architecture is defined for deep learning.

The architecture is defined to include two or more networks or sub-parts. A cascade architecture is used for joint operation. One network is provided for reconstruction of the fingerprint or fingerprints, and another network is provided for regression of the estimates of the multiple tissue parameters (e.g., T1, T2, PD, etc.) for each location. Additional networks within the cascaded neural network may be provided.

The reconstruction network receives as input MR data. The MR data may be k-space data. Multiple fingerprints may be formed for multiple locations from k-space data. The MR data may instead be one or more fingerprints. The fingerprint is formed from Fourier transform of the k-space data. The fingerprint to be input is in the image or object domain. A response over time for a given location is generated as the fingerprint.

The input may be for a single fingerprint per instance or may be for an image of multiple fingerprints per instance. For a single fingerprint, the network is defined to provide estimates pixel-by-pixel in sequence. MR data for one fingerprint is input at a time. For multiple fingerprints, the network is defined to provide estimates for multiple locations where MR data for an image of fingerprints (e.g., two spatial dimensions and time) in input per instance. MR data for one or three-dimensional distribution of locations and corresponding fingerprints may be input. MR data for a whole (all spatial locations) or patch (sub-set of the spatial locations) may be used as the input.

The reconstruction network is defined to output a fingerprint or multiple fingerprints. For input of a single fingerprint or k-space data for a single fingerprint, the reconstruction network is defined to generate a fingerprint with less noise content. The machine training teaches the network to generate a denoised fingerprint. For input of multiple fingerprints or k-space data for multiple locations in one instance, the reconstruction network is defined to generate multiple fingerprints or one fingerprint for each of multiple locations (i.e., spatial distribution of fingerprints). The fingerprints have less noise than the input fingerprint or a fingerprint generated from the input k-space data.

The regression network is to be trained to estimate values for one, two or more types of tissue parameters based on a same input fingerprint. Any type of MR tissue parameter may be estimated, such as estimating parameters as two or more of T1, T2, PD, off-resonance, magnetic transfer, B1 etc. (e.g., estimating T1, T2, and PD values for each location based on a given fingerprint for that location and/or fingerprints for that location and other locations).

Each network (e.g., reconstruction network and regression network) is formed of the same or different type, such as both networks being fully-connected networks, both being convolutional networks, or the reconstruction network being convolutional or dense network and the regression network being as a dense network or a fully-connected network. Any appropriate network architecture may be used for one or both components or networks, such as fully-connected, recurrent, convolutional, dense, U-net, generative, etc. Any machine learning and corresponding network architecture may be used.

Various layer or block structures may be used for each network. Max pooling, convolutional, fully connected, and/or other layers may be used. Feed forward, bi-directional, skip, or other connections between layers may be used. The same or different structure is provided for each network.

FIGS. 2-6 show example network architectures for a cascaded neural network. The neural networks in these examples have separate parts or networks intended for distinct functions. Acquired MRF signals with a high noise level are input to a "denoising" or reconstruction neural network 20. The task of the reconstruction network 20 is to decrease the noise level in the signal. The denoised signals (e.g., reconstructed fingerprint or fingerprints) are then fed to a second component or regression network 22 that applies a regression to obtain values for the tissue parameters.

Figure 2:
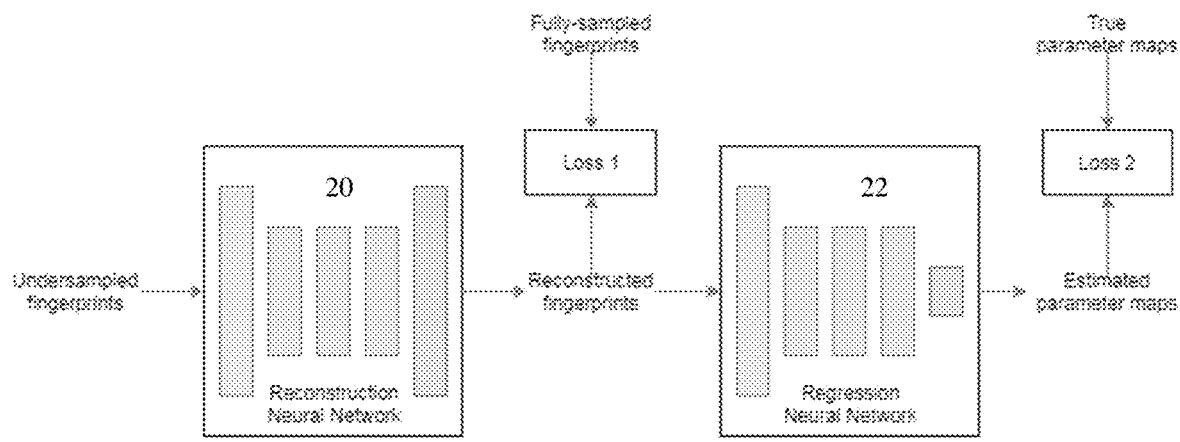
FIGS. 2-6 illustrate example network architectures for reconstruction and parameter estimation in MRF.

FIG. 2 shows a "1D denoising+1D regression" network. "1D" represents input of a single fingerprint in application, so the one dimension is time for the fingerprint of a single location. The neural network processes the incoming MRF images pixel-by-pixel. The input to the reconstruction network is the fingerprint in the object domain. The first denoising part (reconstruction network 20) has four fully connected layers and has 64, 64, 64, (input fingerprint size) neurons, respectively. The second regression part (regression network 22) has four fully connected layers and has 256, 256, 128, and a number of output tissue parameter(s) (e.g., 2) neurons, respectively.

Figure 3:
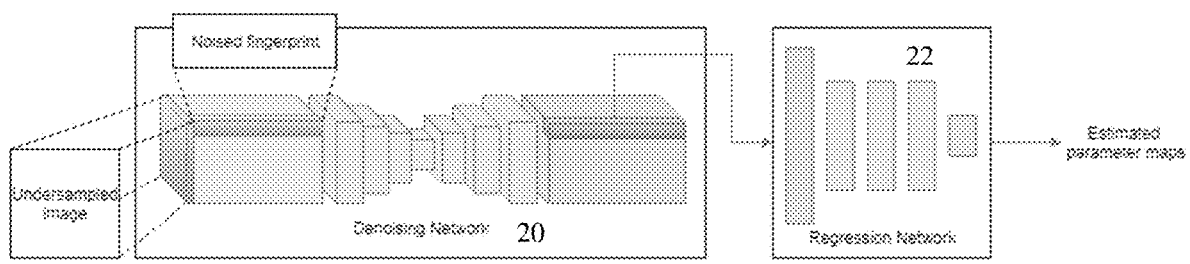

FIG. 3 shows a "2D denoising+1D regression" network. The first denoising part (reconstruction network 20) is a Dense U-net composed of 3 max poolings. The input channel dimension takes the temporal dimension of the fingerprint images. 2D is used to show a spatial distribution of the fingerprints as an input image with a third dimension being time (i.e., fingerprint of scalar over time for each location in 2D as the input). The third dimension may be time or may be fingerprints that have been compressed along time, such as compression using PCA or SVD. The blocks are composed of 3 convolutional layers with kernels of size 3 by 3 and a growth rate of 8. The output is a denoised image (e.g., 2D spatial distribution of denoised fingerprints). The "regression" part (regression network 22) has four fully connected layers and has 256, 256, 128, a number of output tissue parameters neurons, respectively, and operates pixel-by-pixel (i.e., takes as input a denoised fingerprint location by location in sequence). Each fingerprint or 1D MRF signal is regressed to tissue parameters pixel-by-pixel.

Figure 4:
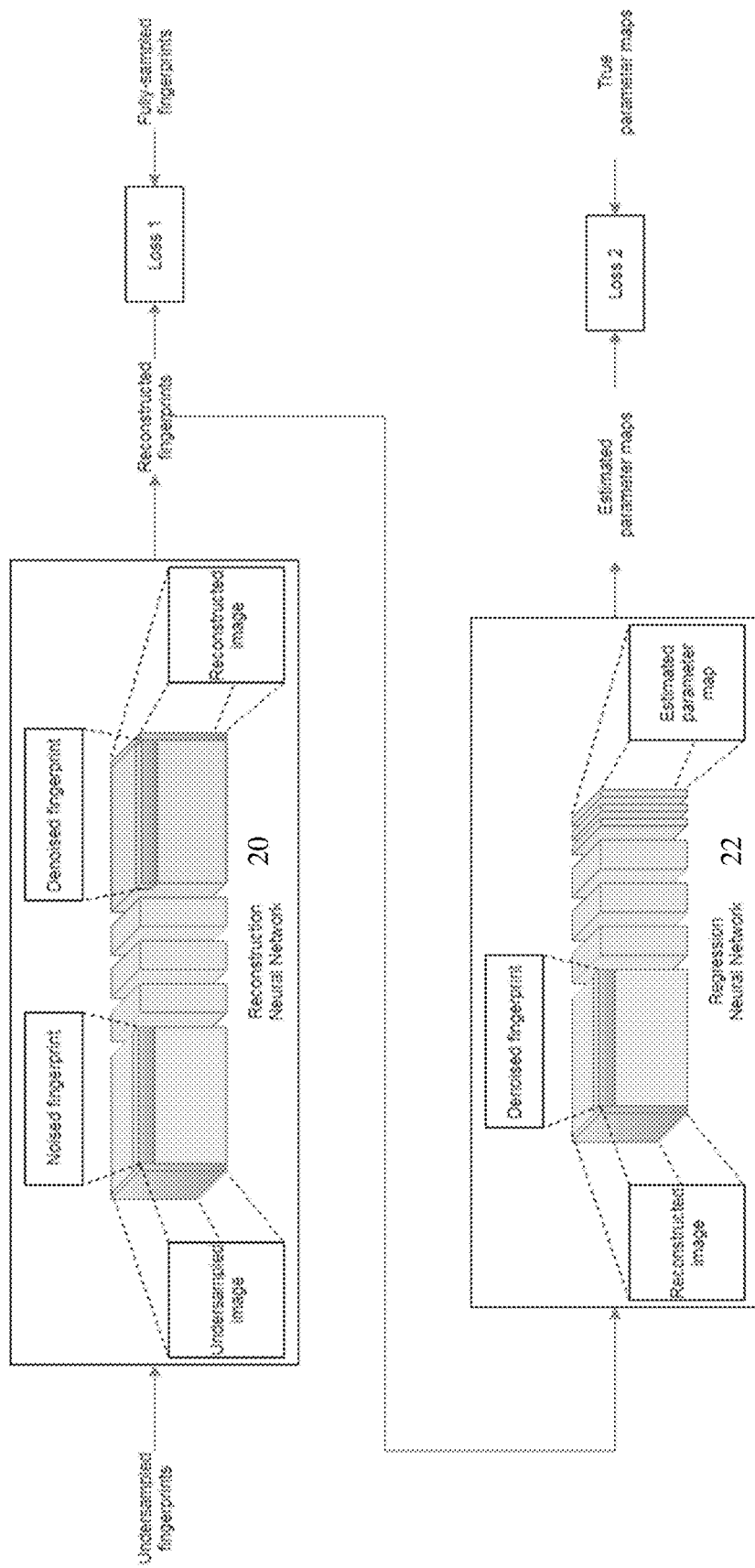

FIG. 4 shows an example "2D denoising+2D regression" network. The reconstruction network 20 receives input of a fingerprint image and outputs an image of denoised fingerprints. The regression network 22 receives input of the image of the denoised fingerprints and outputs values of multiple parameters for each of the locations in the spatial distribution.

Figure 5:
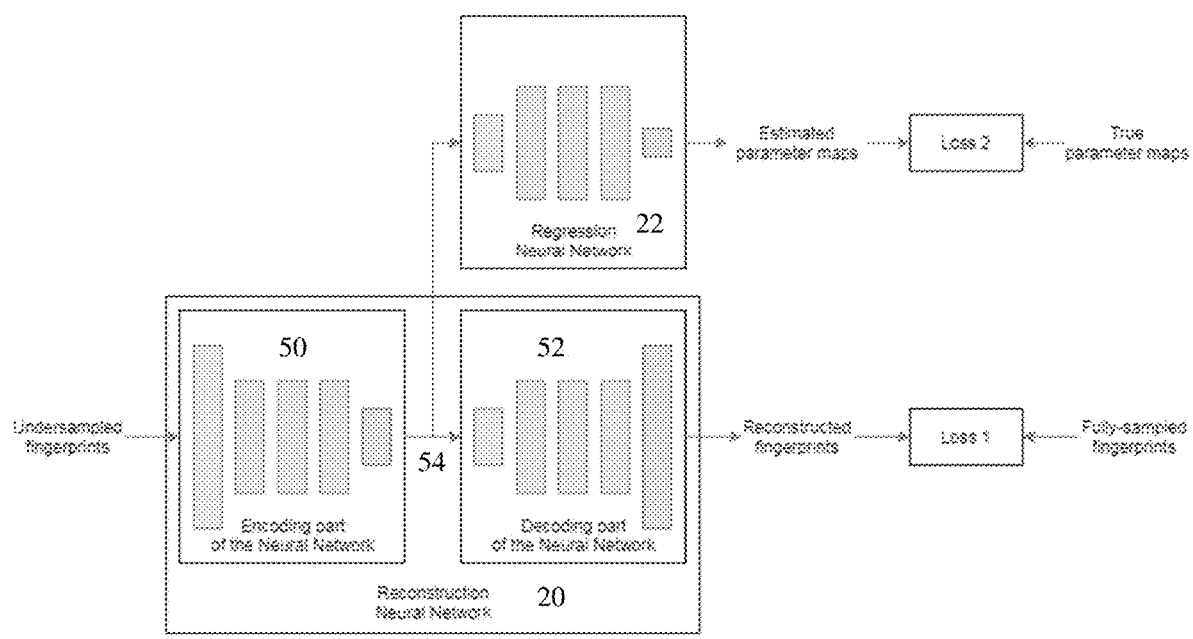

FIG. 5 shows an embodiment using a U-net or encoder-decoder arrangement for the reconstruction network 20. The reconstruction network 20 is defined to include an encoder 50 and decoder 52 connected by a bottleneck 54. The encoder 50 increases the amount of abstraction, and the decoder 52 decreases the amount of abstraction. The bottleneck 54 is a connection and/or neural network layer passing the values for the most abstract features from the encoder 50 to the decoder 52. Skip connections from the encoder 50 to the decoder 52 at other levels of abstraction or resolution may be used. The encoder 50 and decoder 52 form a generative or image-to-image network, but other encoder-decoder networks may be used. The decoder 52 is defined to output the reconstructed (e.g., denoised) fingerprint.

Rather than inputting the reconstructed fingerprints from the reconstruction network 20 into the regression network 22, the values of features from the bottleneck 54 (e.g., values of features from the most abstract and/or least resolution) are input to the regression network 22. The output of the encoder 50 and/or input to the decoder 52 are input to the regression network 22. Outputs from other layers of the encoder and/or decoder may be used as the inputs to the regression network 22 in alternative embodiments. The entire reconstruction network 20 is not used to generate the input to the regression network 22. Intermediate results are used.

Figure 6:
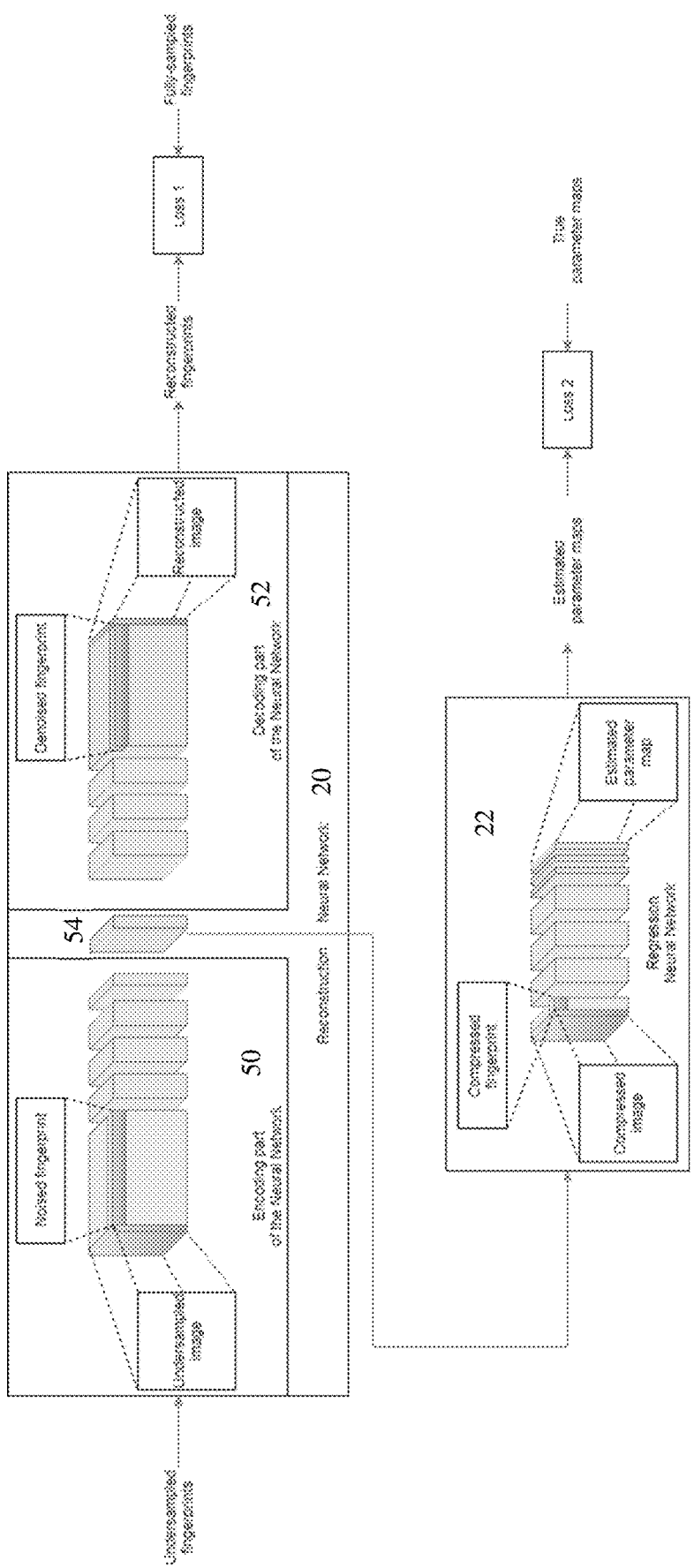

FIG. 5 shows a 1D denoising+1D regression network using the encoder-decoder arrangement. FIG. 6 shows a "2D denoising+2D regression" network using the encoder 50-decoder 52 arrangement of FIG. 5. Other network architectures defined to provide both reconstruction (e.g., denoising) of the fingerprint or fingerprints and regression of estimates of the MRF tissue parameters from the reconstructed fingerprints may be used.

Referring again to FIG. 1, an image processor or another machine trains the neural network. Machine learning is applied. Many samples (e.g., thousands) of input and linked ground truth outputs are used to optimize settings (e.g., convolution kernels, connections, and/or weights) of the network. The network is trained using training data to receive MR data and output estimates of tissue parameters with or without outputs of reconstructed fingerprints.

For training, ground truth data is used. Ground truth for reconstruction and ground truth for regression are both used. The ground truth for reconstruction are reconstructed fingerprints. For example, fingerprints from full sampling are used as the ground truth as these fingerprints have less noise (e.g., less aliasing). Under sampled fingerprints, such as the fully sampled fingerprints down sampled, are used as the input samples. Fingerprints with more noise are input as training data, and the same fingerprints but with less noise are used as the ground truth. In an additional or alternative embodiment, the ground truth fingerprints are simulated using MR physics simulation, such as Bloch simulation. For example, with known T1 and T2, the fingerprint may be simulated. These simulated fingerprints have zero noise compared to fingerprints that are reconstructed from fully-sampled data that still possess some noise and error.

The ground truth for the regression are parameter maps. The correct values of the parameters for a location or spatial distribution of locations are provided as ground truth. For example, T1 and T2 or T1, T2, and PD maps are provided for a two-dimensional distribution of locations. The input samples for the regression networks 22 are the reconstructed fingerprints from the reconstruction networks 20, with the ground truth being provided by the parameter maps. A plurality of ground truth values corresponding to the plurality of output MR parameters is provided. The ground truths may be from scans of patients or pre-determined from scan simulation (e.g., pre-determine T1, T2 maps→MR physics simulation→simulated fingerprints→simulated fully-sampled k-space→undersampled k-space→undersampled fingerprints (or undersampled MRF images). The scans may be of the same patient but using different sequences, sampling, added noise, and/or reconstruction to separately generate each of the MR parameter maps. The ground truths are for a given application (e.g., organ and/or pathology) and/or MR scanner or type of scanner.

During training, a reconstruction loss and a regression loss are calculated. Any loss function may be used, such as L1, L2, PSMR, or SSIM. Different or the same loss function may be used for the reconstruction and regression losses. The network generated output of the reconstructed fingerprints is compared to the ground truth fingerprints to provide a reconstruction loss. The network generated output of the estimated values of the tissue parameters are compared to the ground truth parameter values to provide a regression loss. Since different parameters are estimated for each fingerprint, a separate loss is determined for each output MR parameter, such as a T1 score, T2 score, and PD score. For a given parameter, the score is based on information from multiple locations in the 2D network case. The scores of different parameters may be maintained separately for loss calculation and training. Alternatively, a weighted summation or other combination is used to determine regression loss.

The training is informed by the different losses. The training of the regression network 22 using the regression loss may benefit by the training of the reconstruction network 20 using the reconstruction loss. There are different ways to use the reconstruction and regression losses in training.

In one approach, the reconstruction network 20 is trained using the ground truth data for reconstruction, and then the regression network 22 is trained using the ground truth for regression. The cascade is trained sequentially where training of the regression network 22 uses the trained reconstruction network 20. The reconstruction and regression networks 20, 22 are used as two different networks. The whole pipeline benefits from the two sources of information, reconstruction loss and regression loss. The noise level in the signal is decreased, reshaping the fingerprints before computing the regression.

In another approach, the reconstruction and regression networks are trained end-to-end using both the reconstruction and regression losses. The entire network is trained at a same time based on both losses from the corresponding ground truths. The reconstruction and regression networks 20, 22 are treated as one larger network, producing the reconstruction as an intermediate result and the regression as a final result. In this case, the reconstruction network 20 is trained using both the reconstruction and regression losses, and the regression network 22 is trained using the regression loss. Both reconstruction and regression problems benefit from each other's data to compute their results. The two problems are combined to reconstruct the fingerprints, not only for denoising, but also for transmitting the required information for the regression, which may include more specific parts of the fingerprints or even some information on the noise itself. The reconstruction component may be used independently for reconstruction purposes.

Another approach uses the losses in the encoder-decoder arrangement, such as shown in FIGS. 5 and 6. The encoder 50 and decoder 52 are trained with the ground truth for reconstruction and corresponding reconstruction loss. The regression network 22 is trained with features from the bottleneck of the reconstruction network 20. The regression network 22 is trained using the regression loss, the decoder 52 is trained using the reconstruction loss, and the encoder 50 is trained using both the reconstruction and regression losses. This training may be faster and less prone to overfitting because crucial information is compressed by the encoder 50.

Other approaches may be used to train a cascade using two or more different losses.

In act 14 of FIG. 1, the image processor or other machine stores the trained network. The convolution kernels, connections, weights, architecture, and/or other information characterizing the network as trained are stored. The storage is for later use of the machine-trained network and/or for later retraining.

The storage may be local to the machine used to train. Alternatively, copies of the stored network are provided to other devices, such as MRF scanners for application by those other devices.

Figure 7:
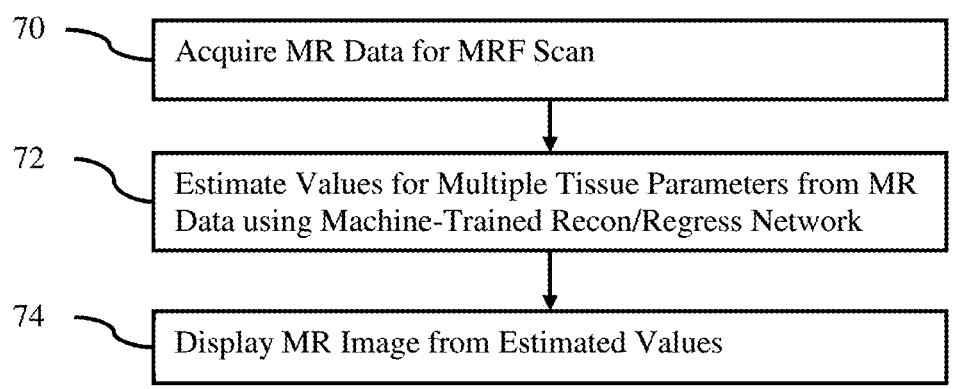
FIG. 7 is a flow chart of one embodiment of a method for machine training a network for tissue parameter estimation using MRF.

FIG. 7 shows one embodiment of a method for tissue parameter estimation by a MR scanner using MRF. A machine-trained network is used to estimate values for multiple tissue parameters for MRF. The network as trained includes both reconstruction and regression components.

The method is implemented by an image processor with or without other devices. For example, an MR scanner acquires data from an MRF scan of a patient. The image processor, such as an image processor of the MR scanner, estimates the values of the multiple tissue parameters by applying the acquired data to the machine-trained network. The image processor generates an image for display on a display, such as the display of the MR scanner.

The acts are performed in the order shown (top to bottom or numerical) or other order. Additional, different, or fewer acts may be provided. For example, act 74 is not provided. As another example, acts for configuring the MR scanner to acquire data or storage of results in a computerized medical record or picture archiving communications system (PACS) are provided.

In act 70, an image processor or MR scanner acquires MR data. The MR data is acquired by scanning the patient. Alternatively, the MR data is acquired by loading from memory and/or transfer over a computer network from a previous MR scan.

The MR data is from a MRF scan of a patient by the MR scanner. The MR scanner is configured by settings for flip angle, repetition time, sequence length, and other settings defining the MR pulses to scan a patient. The sequence of MR pulses is a pseudo-randomly designed sequence or any other MRF sequence. The trajectory (e.g., Cartesian, radial, or spiral), amount of under sampling (e.g., using 24 spirals where 48 spirals sample the full k-space), uniformity of sampling (e.g., which of the sub-sampled spirals to include), and/or different sampling orders (e.g., the sequence of spirals used) may be set for the MRF scan. Other settings for sampling may be used.

The under sampled k-space data is acquired for input to the machine-trained network. Alternatively, a fast Fourier transform is applied to generate one or more fingerprints in object space. The scan is for a single location or for a one, two, or three-dimensional distribution of locations. Using the MRF sequence, under sampled k-space data and/or fingerprint or fingerprints are acquired.

In act 72, the image processor of the MR scanner or a computer estimates values for a plurality of tissue parameters from the MR data. The image processor applies the MR data as an input to a machine-trained network. The MR data may be filtered and/or otherwise image processed prior to application, such as filtering temporally and/or spatially. The k-space data or one or more fingerprints from the scan of the patient are input to the machine-trained network.

The machine-trained network has an architecture incorporating reconstruction from the MR data and regression of the estimating from the reconstruction. The architecture includes one neural network for reconstruction and another neural network for regression of the estimates. For example, one of the networks, after training, shown in FIGS. 2-6 is used. Additional, different, or fewer networks may be included in a reconstruction-regression cascade network.

The reconstruction structure in the architecture outputs one or more fingerprints in object space. A reconstruction loss was used in training the reconstruction structure or neural network. A regression loss may or may not have also contributed to the training of the reconstruction structure. The output one or more fingerprints have less noise than the input one or more fingerprints. Where k-space data is input, the output one or more fingerprints have less noise than one or more fingerprints formed by the input k-space data. The aliasing may be reduced and/or removed by the machine-trained network.

The regression structure in the architecture outputs values for two or more tissue parameters for each location. A regression loss was used in training the regression structure for the regression. A reconstruction loss may contribute through use of the trained reconstruction structure in having trained the regression structure. The regression structure as trained estimates the values for at least two tissue parameters from the group of T1, T2, and PD. Other combinations of these three tissue parameters or other tissue parameters may be used. Due to the use of reconstruction loss in training the regression with the regression loss, more accurate estimates of the tissue parameters may result. The values of the tissue parameters are output by the machine-trained network for one or more locations, such as outputting a T1 map and a T2 map.

The machine-trained network estimates the tissue parameters based on previous training. The values of the estimates may be different where different approaches and/or training data are used in training. The reconstruction and regression losses may have been used in various approaches for that previous training. For example, the machine-trained network was sequentially trained with the reconstruction loss and then the regression loss. As another example, the machine-trained network was trained end-to-end with the reconstruction loss and the regression loss. In yet another example, the machine-trained network includes an encoder and a decoder connected by a bottleneck where the encoder and decoder were trained with the reconstruction loss. The regression network received feature values from the bottleneck in training and was trained with the regression loss.

Since the reconstruction and regression networks produce both the de-noised fingerprints and the tissue parameters, the machine-trained network may be used in iterative reconstruction. In each iteration, the machine-trained network is applied to estimate values of tissue parameters given input MR data altered by optimization. The recovered image estimations may be used in the iterations or optimization.

In act 74, the image processor displays one or more MR images on a display screen, such as a display of the MR scanner or a workstation. The MR images are formed from values of the tissue parameters. For example, T1 and T2 maps are displayed. One image may be formed from multiple types of tissue parameters, such as T1 in grayscale with color from T2 overlaid or incorporated. Images from all or any sub-set of one or more of the estimated tissue parameters may be displayed (e.g., displaying T1, T2, and/or PD-based images). Any MRF imaging may be used.

Figure 8:
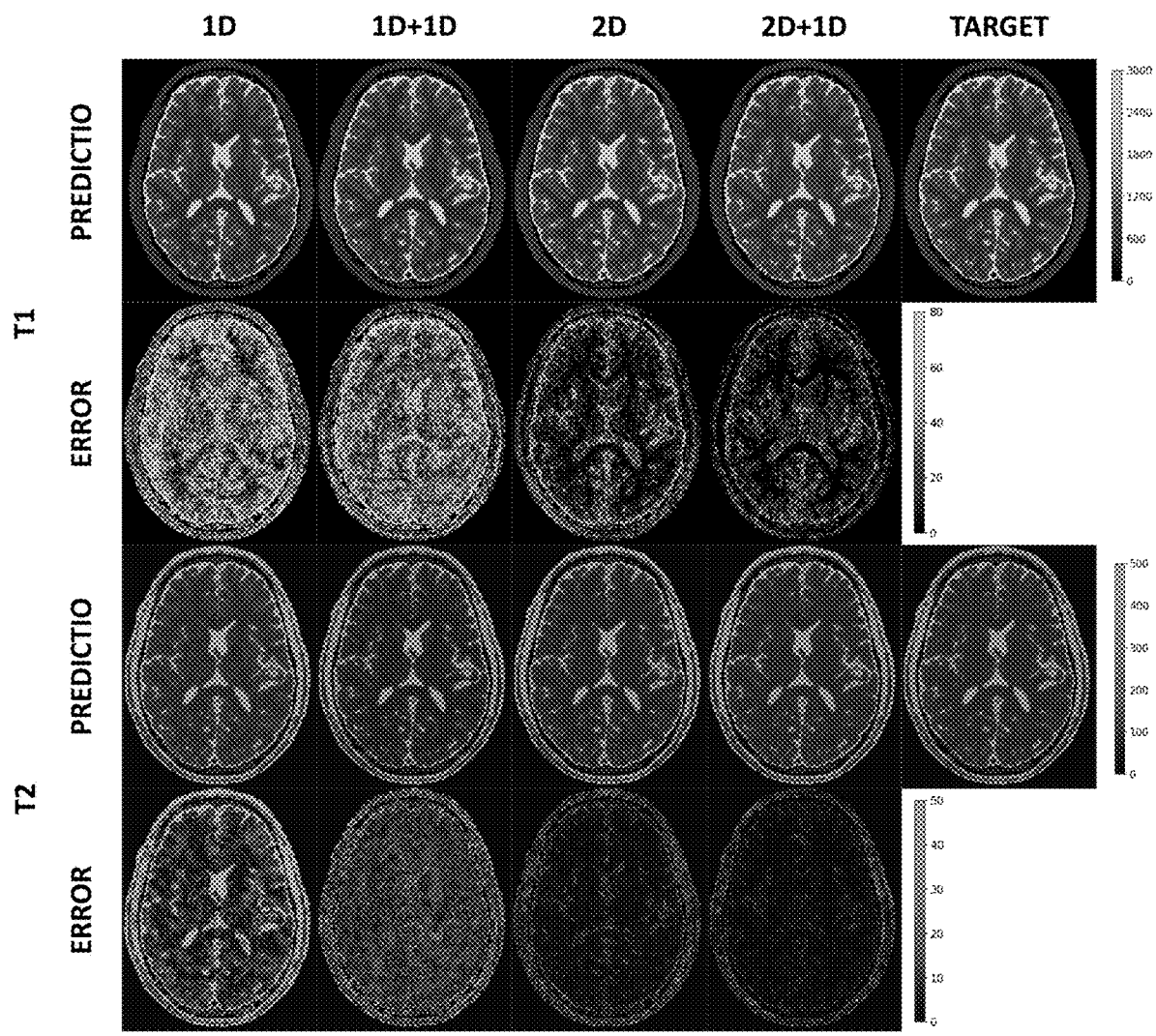
FIG. 8 shows example tissue parameter maps estimated by various machine-trained networks.

FIG. 8 shows MR brain images for T1 and T2 values estimated using machine-trained networks: 1D, 1D+1D, 2D, and 2D+1D. For "1D," a machine-trained neural network without the reconstruction network using pixel-by-pixel (i.e., input of single fingerprint at a time) is used. A 1D regression is formed by a neural network taking the input 1D MRF signal and outputting tissue parameters. The 1D network estimates T1 and T2 values from an input fingerprint. For "1D+1D," the network of FIG. 2 is used. For "2D," a machine-trained neural network without the reconstruction network using a 2D fingerprint image is used. A 2D regression is formed by a convolutional neural network taking the input 2D MRF signal and outputting tissue parameter maps. For the "2D+1D," the network of FIG. 3 is used. FIG. 8 shows the predicted T1 and T2 maps for each network based on the same input fingerprints and the error from the target maps.

For training the networks, 20 digital brains were adopted from Brainweb. Perturbation of pre-defined tissue T1, T2 values (max 10%) were implemented to generate more tissue parameter variations in the training dataset while keeping the values realistic. A total of 29,400 transverse slices were used. An MRF scan using a FISP sequence of 1000 TRs was simulated using Bloch simulation, and single-shot spiral acquisition with an acceleration rate of 48 was simulated. The under sampled MRF data were split into training (90%) and validation (10%).

For testing, additional Gaussian noise at various levels (from 0% to 25% by step of 5%) were added to the testing data. FIGS. 9 and 10 show the performances of the different networks with different noise levels for the T1 and T2 mapping, respectively. The error is less for the networks using reconstruction. For networks operating only on a 1D fingerprint, when the noise level is low, the reconstruction module helps reduce the error level. For networks operating on 2D fingerprints, at all noise levels, the methods with the reconstruction module provided lower level of error.

Explicit separate components are provided for denoising the highly under sampled MRF signals before estimating the tissue parameters. This structure offers the flexibility to use different neural networks for different tasks. The results demonstrate the benefit of adopting this structure over direct regression. The neural network structure incorporates combined "denoising" and "regression" loss where the intermediate denoised signal is compared to a ground truth fully sampled signal.

Figure 11:
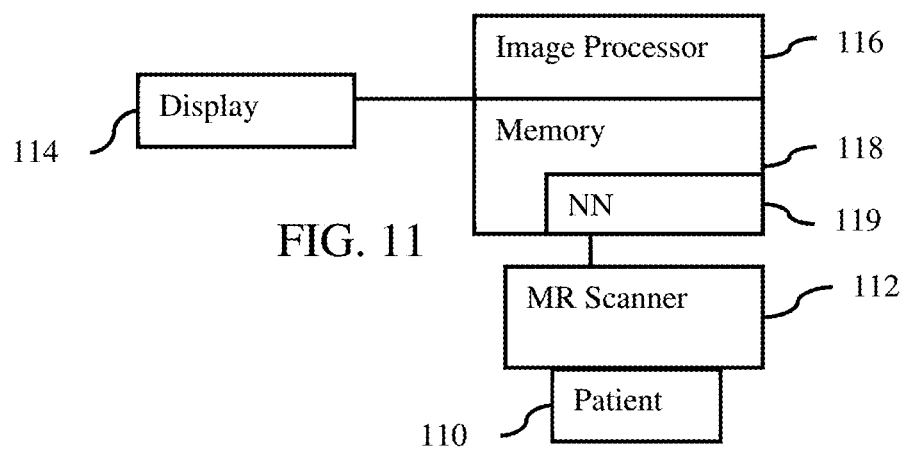
FIG. 11 is a block diagram of one embodiment of a MR system for tissue parameter estimation using MRF.

FIG. 11 is a block diagram of a medical imaging system for training and/or applying a neural network with a cascade of a reconstruction or denoising network and a regression network for estimating MR tissue parameters values using MRF. The medical imaging system includes the display 114, memory 118, and image processor 116. The display 114, image processor 116, and memory 118 may be part of the MR scanner 112, a computer, server, or other system for image processing to estimate tissue parameter values for imaging the patient 110. A workstation or computer without the MR scanner 112 may be used as the medical imaging system. Additional, different, or fewer components may be provided, such as including a computer network for remote training and/or application of the trained network.

The MR scanner 112 is a medical diagnostic imaging system configured to scan a volume of a patient and generate anatomical information from the scan. A main magnet or coil generates a substantially uniform magnetic field through the patient 110. Gradient coils, local coils, and/or a whole-body coil generate a pulse sequence to shift spin axes of molecules in the patient away from the uniform magnetic field lines. The local coils and/or whole-body coil detect radio frequency emissions caused by the relaxation of the spin axes of the molecules returning to the magnetic field lines. This k-space data is reconstructed into an object or spatial domain using Fourier processing. After transform, the scan or image data represents tissue response from a region of the patient 110.

The pulse sequence may be repeated or continues to obtain scan data representing the region over time. The pulse sequence, sampling, and reconstruction are for MRF. Parameter maps or images for multiple MR parameters are generated from the same scan using fingerprinting. The transformation generates fingerprints for each location. Using a knowledge base of the machine-trained neural network, the values of multiple tissue parameters are determined from the fingerprint.

The image processor 116 is a control processor, general processor, digital signal processor, three-dimensional data processor, graphics processing unit, application specific integrated circuit, field programmable gate array, artificial intelligence processor, digital circuit, analog circuit, combinations thereof, or other now known or later developed device for training and/or applying a machine-learned network in MRF. The image processor 116 is a single device, a plurality of devices, or a network. For more than one device, parallel or sequential division of processing may be used. Different devices making up the image processor 116 may perform different functions. In one embodiment, the image processor 116 is a control processor or other processor of a medical diagnostic imaging system, such as the MR scanner 112. The image processor 116 operates pursuant to stored instructions, hardware, and/or firmware to perform various acts described herein, such as training, storing, acquiring, estimating, and/or displaying.

The image processor 116 is configured to train a neural network 119. Training data, including MR data (e.g., k-space or fingerprint data) and ground truths for both fingerprints and tissue parameter estimates, are used to train the network 119. The network 119 is configured to include a cascade for reconstructing or denoising the fingerprints and for estimating values of parameters from the resulting fingerprints.

The image processor 116 is configured to apply the machine-learned network 119. MR data for a specific patient is input to the network 119. The MR data is from MRF scanning. In response to application of the MR data, the network 119 reconstructs one or more fingerprints and estimates values for two or more tissue parameters for each location. The image processor 116 estimates the values using the machine-learned network 119.

The image processor 116 is configured to output images showing spatial distribution of the tissue parameters. Using MRF, the image processor 116 generates two or more parameter maps.

The display 114 is a CRT, LCD, projector, plasma, printer, tablet, smart phone or other now known or later developed display device. The display 114 displays the MR parameter maps as images. Using the MRF configuration, the MR scanner 112 generates images of multiple MR parameters for the patient 110. The display 114 displays the images from the scan of the patient 110. The display 114 displays medical images for diagnosis, prognosis, and/or treatment. Due to the structure and/or training using both reconstruction and regression loss, the accuracy of the estimates is better than without including reconstruction in the network.

The instructions, ground truths, values of settings, machine-learned network 119, outputs, configuration, and/or other information are stored in a non-transitory computer readable memory, such as the memory 118. The memory 118 is an external storage device, RAM, ROM, database, and/or a local memory (e.g., solid state drive or hard drive). The same or different non-transitory computer readable media may be used for the instructions and other data. The memory 118 may be implemented using a database management system (DBMS) and residing on a memory, such as a hard disk, RAM, or removable media. Alternatively, the memory 118 is internal to the processor 116 (e.g. cache).

The instructions for implementing the processes, methods, and/or techniques discussed herein are provided on non-transitory computer-readable storage media or memories, such as a cache, buffer, RAM, removable media, hard drive or other computer readable storage media (e.g., the memory 118). Computer readable storage media include various types of volatile and nonvolatile storage media. The functions, acts or tasks illustrated in the figures or described herein are executed by the image processor 116 in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone or in combination.

In one embodiment, the instructions are stored on a removable media device for reading by local or remote systems. In other embodiments, the instructions are stored in a remote location for transfer through a computer network. In yet other embodiments, the instructions are stored within a given computer, CPU, GPU or system. Because some of the constituent system components and method steps depicted in the accompanying figures may be implemented in software, the actual connections between the system components (or the process steps) may differ depending upon the manner in which the present embodiments are programmed.

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method for tissue parameter estimation for a magnetic resonance scanner using magnetic resonance fingerprinting, the method comprising:
    acquiring magnetic resonance data from a magnetic resonance fingerprinting scan of a patient by the magnetic resonance scanner;
    estimating values for a plurality of tissue parameters from the magnetic resonance data, the estimating being by an image processor applying the magnetic resonance data as an input to a machine-trained network comprising an architecture incorporating reconstruction from the magnetic resonance data in a reconstruction network of the architecture and regression of the values by estimating from information from the reconstruction network in a regression network of the architecture; and
    displaying a magnetic resonance image or images from the values of the plurality of tissue parameters.

2. A method for machine training a network for tissue parameter estimation using magnetic resonance fingerprinting, the method comprising:
    defining a neural network having an architecture with a first network configured to reconstruct a reconstructed fingerprint and a second network configured to regress estimates of tissue parameters from information from the first network;
    training, by a machine, the neural network with ground truth data for reconstruction and ground truth data for regression; and
    storing the trained network.

3. The method of claim 1 wherein acquiring comprises acquiring k-space data with a pseudo-random sequence, and wherein estimating comprises applying the k-space data as the input to the machine-trained network.

4. The method of claim 1 wherein acquiring comprises acquiring one or more fingerprints in object space, and wherein estimating comprises applying the one or more fingerprints as the input to the machine-trained network.

5. The method of claim 1 wherein estimating comprises estimating by the machine-trained network having been trained to output a reconstruction of the input.

6. The method of claim 5 wherein estimating comprises estimating the reconstruction as one or more fingerprints in object space with less noise than the input.

7. The method of claim 1 wherein acquiring comprises acquiring the magnetic resonance data as data for a two-dimensional distribution of fingerprints, and wherein estimating comprises estimating with the reconstruction being of the two-dimensional distribution of the fingerprints.

8. The method of claim 1 wherein acquiring comprises acquiring the magnetic resonance data as data for a single fingerprint, and wherein estimating comprises estimating with the reconstruction being of the single fingerprint.

9. The method of claim 1 wherein estimating comprises estimating with the machine-trained network comprising a first neural network for the reconstruction network and a second neural network for the regression network.

10. The method of claim 1 wherein estimating comprises estimating with the machine-trained network comprising a neural network having been trained with a reconstruction loss for the reconstruction network and a regression loss for the regression network.

11. The method of claim 10 wherein estimating comprises estimating with the machine-trained network having been sequentially trained with the reconstruction loss and then the regression loss.

12. The method of claim 10 wherein estimating comprises estimating with the machine-trained network having been trained end-to-end with the reconstruction loss and the regression loss.

13. The method of claim 10 wherein estimating comprises estimating with the machine-trained network including an encoder and a decoder connected by a bottleneck for the reconstruction network where the encoder and decoder having been trained with the reconstruction loss and including another network for the regression network, the other network receiving feature values from the bottleneck as the information where the other network having been trained with the regression loss.

14. The method of claim 1 wherein estimating comprises estimating the values for at least two tissue parameters from the group of T1, T2, and PD, and wherein displaying comprises displaying for the at least two tissue parameters from the group of T1, T2, and PD.

15. The method of claim 2 wherein defining comprises defining the neural network to have the first network configured to reconstruct a spatial distribution of fingerprints including the reconstructed fingerprint and to have the second network configured to regress the estimates for each location in the spatial distribution.

16. The method of claim 2 wherein training comprises training the first network with an input of fingerprints with noise and the ground truth for the reconstruction being the fingerprints with less of the noise.

17. The method of claim 2 wherein training comprises training the first network with the ground truth data for reconstruction and then training the second network with the ground truth for regression, the training of the second network using the trained first network.

18. The method of claim 2 wherein training comprises training the first and second networks end-to-end as the neural network using both a reconstruction loss based on the ground truth for the reconstruction and a regression loss based on the ground truth for the regression.

19. The method of claim 2 wherein the first network comprises an encoder connected to a decoder through a bottleneck, wherein training comprises training the encoder and decoder with the ground truth for the reconstruction, wherein the second network is configured to receive feature values from the bottleneck as the information, and wherein training comprises training the second network with input of the feature values from the bottleneck.

20. The method of claim 2 wherein defining the network comprises defining the second network to regress the estimates of tissue parameters as two or more selected from the group of T1, T2, and PD, and wherein training comprises training with the ground truth for the regression being the two or more selected from the group of T1, T2, and PD.

* * * * *